US007995216B2

(12) United States Patent
Van Berkel et al.

(10) Patent No.: US 7,995,216 B2

(45) Date of Patent: Aug. 9, 2011

(54) CONTROL OF THE POSITIONAL RELATIONSHIP BETWEEN A SAMPLE COLLECTION INSTRUMENT AND A SURFACE TO BE ANALYZED DURING A SAMPLING PROCEDURE WITH IMAGE ANALYSIS

(75) Inventors: Gary J. Van Berkel, Clinton, TN (US); Vilmos Kertesz, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 617 days.

(21) Appl. No.: 12/217,224

(22) Filed: Jul. 2, 2008

(65) Prior Publication Data

US 2010/0002905 A1 Jan. 7, 2010

(51) Int. Cl.
*G01B 11/14* (2006.01)
*G01N 1/02* (2006.01)
*H01J 37/26* (2006.01)

(52) U.S. Cl. ...... 356/614; 356/394; 250/306; 73/863.01

(58) Field of Classification Search .................. 356/601, 356/614–615, 392–394; 250/491.1, 557, 250/559.31, 201.3, 306–307; 382/100, 145–154; 73/863.01, 105

See application file for complete search history.

(56) References Cited

U.S. PATENT DOCUMENTS

| | | | |
|---|---|---|---|
| 5,081,353 A | 1/1992 | Yamada et al. | |
| 5,196,713 A * | 3/1993 | Marshall | 250/559.31 |
| 5,200,603 A | 4/1993 | Hackenberg et al. | |
| 5,557,156 A * | 9/1996 | Elings | 310/316.01 |
| 5,744,799 A * | 4/1998 | Ohara | 850/3 |
| 6,803,566 B2 | 10/2004 | Van Berkel | |
| 7,295,026 B2 | 11/2007 | Van Berkel et al. | |
| 2006/0284084 A1 | 12/2006 | Morimoto et al. | |

* cited by examiner

*Primary Examiner* — Sang Nguyen

(74) *Attorney, Agent, or Firm* — Michael E. McKee

(57) ABSTRACT

A system and method utilizes an image analysis approach for controlling the collection instrument-to-surface distance in a sampling system for use, for example, with mass spectrometric detection. Such an approach involves the capturing of an image of the collection instrument or the shadow thereof cast across the surface and the utilization of line average brightness (LAB) techniques to determine the actual distance between the collection instrument and the surface. The actual distance is subsequently compared to a target distance for re-optimization, as necessary, of the collection instrument-to-surface during an automated surface sampling operation.

19 Claims, 6 Drawing Sheets

CONTROL OF THE POSITIONAL RELATIONSHIP BETWEEN A SAMPLE COLLECTION INSTRUMENT AND A SURFACE TO BE ANALYZED DURING A SAMPLING PROCEDURE WITH IMAGE ANALYSIS

This invention was made with Government support under Contract No. DE-AC05-00OR22725 awarded by the U.S. Department of Energy to UT-Battelle, LLC, and the Government has certain rights to the invention.

BACKGROUND OF THE INVENTION

This invention relates generally to sampling means and methods and relates, more particularly, to the means and methods for obtaining samples from a surface to be analyzed for subsequent analysis.

The sampling collection techniques with which this invention is concerned involve the positioning of a collection instrument in relatively close proximity to a surface to be analyzed, or sampled, for purposes of gathering an amount (e.g. ions) of the surface for analysis. An example of one such collection technique is used in conjunction with desorption electrospray ionization (DESI) mass spectrometry, but other techniques that require collection of analytes or particles from a surface, such as desorption atmospheric pressure chemical ionization (DAPCI) or matrix-assisted laser desorption/ionization (MALDI), are applicable here as well. In any of such techniques, it is desirable that the collection instrument be maintained at a predetermined, or desired, distance from the surface to be analyzed for optimum collection results and to thereby reduce the likelihood that the collection results will be misinterpreted when subsequently analyzed.

Furthermore, there exists some sample-collecting processes which may require a self-aspirating emitter through which an agent is delivered to the surface to be sampled during the sample-collection process in a spray plume. Such an emitter is commonly fixed in position relative to the collection instrument so that the spray plume is directed toward the surface to be sampled at a predetermined, or fixed, angle of incidence so that the delivered spray plume is intended to strike the surface to be sampled at a predetermined location to thereby effect the movement of an amount of the surface to be sampled toward the collection instrument. In other words, there is a desirable spatial assignment which exists between the emitter, the collection instrument and the surface to be analyzed so that if the surface is not accurately positioned in a location (e.g. within a predetermined plane) in which the surface is intended to be positioned, poor collection results are likely to be obtained.

To obviate the need for an operator to make manual adjustments to the distance between the sample collection instrument and the surface during the course of a sample collection process, it would be desirable to provide a system and method for accurately controlling the collection instrument-to-surface distance during a sample collection process.

Accordingly, it is an object of the present invention to provide a system and method for automatically controlling the distance between a sample collection instrument and the surface to be analyzed, or sampled, with the instrument.

Another object of the present invention is to provide such a system and method which utilizes image analysis techniques for controlling the collection instrument-to-surface distance during a sample collection process.

Still another object of the present invention is to provide such a system and method wherein the collection instrument-to-surface distance is continually monitored throughout the sampling procedure and adjusted, as necessary, so that the collection instrument-to-surface distance is maintained at an optimal spacing.

Yet another object of the present invention is to provide such a system which reduces the likelihood that the results of the sample collection process will be misinterpreted when subsequently analyzed.

A further object of the present invention is to provide such a system which, when used in conjunction with sample-collecting operations which utilize an emitter which is directed at a predetermined angle toward the sample, helps to maintain the proper spatial assignment between the emitter, the collection instrument and the surface to be analyzed during a sample-collecting process.

A still further object of the present invention is to provide such a system which is uncomplicated in structure, yet effective in operation.

SUMMARY OF THE INVENTION

This invention resides in a sampling system and method for collecting samples from a surface to be analyzed.

The system of the invention includes means for moving the collection instrument and the surface toward and away from one another and wherein there exists a desired positional relationship between the collection instrument and the surface for sample collecting purposes. In addition, the system includes means for capturing an image of at least a portion of the collection instrument or a shadow thereof and for generating signals which correspond to the captured image. The are also provided means for receiving the signals which correspond to the captured image and for determining the actual positional relationship between the collection instrument and the surface from the captured image. The system also includes comparison means for comparing the actual positional relationship between the collection instrument and the surface to the desired positional relationship and for initiating the movement of the collection instrument and the surface toward and away from one another when the difference between the actual positional relationship between the collection instrument and the surface and the desired positional relationship is outside of a predetermined range so that by moving the surface and the collection instrument toward or away from one another, the actual positional relationship approaches the desired positional relationship. The means for determining the actual positional relationship between the collection instrument and the surface from the captured image includes means for calculating the distance between a reference location on the image and the collection instrument or the shadow thereof in the image so that the determination of the actual distance between the collection instrument and the surface utilizes the calculated distance.

The method of the invention includes the steps carried out by the system of the invention. In particular, such steps include the capturing of an image of at least a portion of the collection instrument or a shadow thereof cast upon the surface and the determining of the actual positional relationship between the collection instrument and the surface from the captured image. Within this method, the step of determining the actual positional relationship includes a step of calculating the distance from a reference location on the image and the collection instrument or the shadow thereof in the image so that the step of determining the actual positional relationship between the collection instrument and the surface utilizes the calculated distance. Then, the actual positional relationship between the collection instrument and the surface is compared to the desired positional relationship, and the surface and the collection instrument are moved toward or away from one another when the difference between the actual positional relationship and the desired positional relationship is outside of a predetermined range.

DETAILED DESCRIPTION OF AN ILLUSTRATIVE EMBODIMENT

Figure 1:
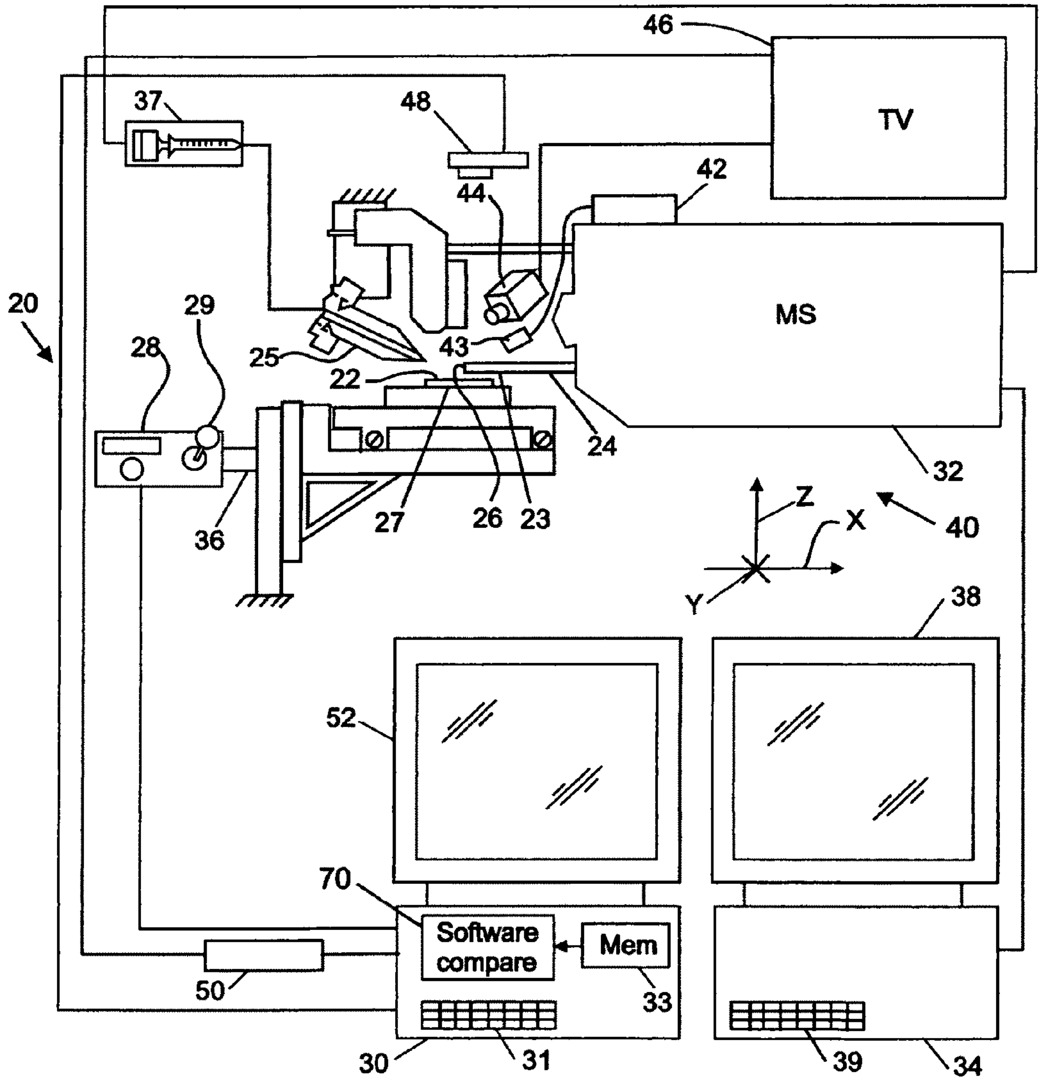
FIG. 1 is a schematic view of the system 20 within with features of the present invention are incorporated.

Turning now to the drawings in greater detail and considering first FIG. 1, there is schematically illustrated an example of an embodiment, generally indicated 20, of a desorption electrospray (DESI) system within which features of the present invention are embodied for purposes of obtaining samples from at least one spot, or area, of a surface 22 (embodying a surface to be sampled) for subsequent analysis. Although the surface 22 to be sampled can, for example, be an array whose samples are desired to be analyzed with a mass spectrometer 32, the system 20 can be used to sample any of a number of surfaces of interest. Accordingly, the principles of the invention can be variously applied.

The system 20 of the depicted example includes a collection instrument in the form of a sampling probe 24 (and an associated DESI emitter 25) comprising a capillary tube 23 which terminates at a tip 26 which is positionable adjacent to the surface 22. During a sampling process, for example, a predetermined agent is directed from a syringe pump 37 and onto the surface 22 to be sampled through the emitter 25, and an amount of the sample (e.g. ions of the sample) is conducted by way of a vacuum and/or an electric field, away from the remainder of the surface 22 through the capillary tube 23 for purposes of analyzing the collected sample.

Figure 2:
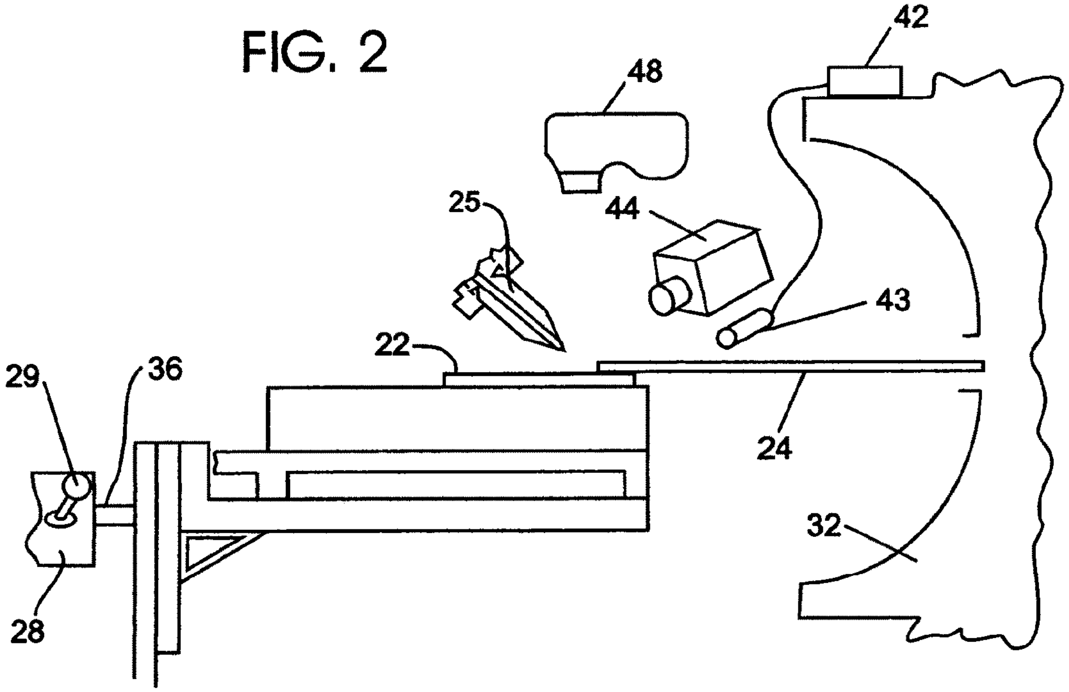
FIG. 2 is a perspective view of selected components of the FIG. 1 system drawn to a slightly larger scale.

With reference to FIGS. 1 and 2 and to enable samples to be collected from any spot along the surface 22 to sampled, the collection tube 23, along with its tip 26, is supported in a fixed, stationary condition, and the surface 22 to be sampled is supported upon a support plate 27 for movement relative to the collection tube 23 along the indicated X-Y coordinate axes, i.e. within the plane of the support plate 27, and toward and away from the tip 26 of the collection tube 23 along the indicated Z-coordinate axis. The support plate 27 of the depicted system can take the form, for example, of a thin-layer chromatography (TLC) plate upon which an amount of material desired to be analyzed is positioned. It follows that for purposes of discussion herein, the surface 22 to be sampled is supported by the support plate 27 within an X-Y plane, and the Z-axis is perpendicular to the X-Y plane.

The emitter 25 is fixed in position with respect to the capillary tube 23 and is arranged in a pre-set relationship with respect to the surface 22 so that a jet (gas or liquid) dispensed thereon impinges upon the surface 22 at a predetermined angle of incidence. It therefore follows that there exists a desired relationship, or spatial assignment, between the capillary tube 23, the emitter 25 and the surface 22 for optimum sample collection results.

The support plate 27 is, in turn, supportedly mounted upon the movable support arm 36 of an XYZ stage 28 (FIG. 1) for movement of the support plate 27, and the surface 22 supported thereby, along the indicated X, Y and Z coordinate directions. The XYZ stage 28 is appropriately wired to a joystick control unit 29 which is, in turn, connected to a first control computer 30 for receiving command signals therefrom so that during a sampling process performed with the system 20, samples can be taken from any desired spot (i.e. any desired X-Y coordinate location) along the surface 22 or along any desired lane (i.e. along an X or Y-coordinate path) across the surface 22 as the surface 22 is moved within the X-Y plane beneath the collection tube tip 26.

Figure 3:
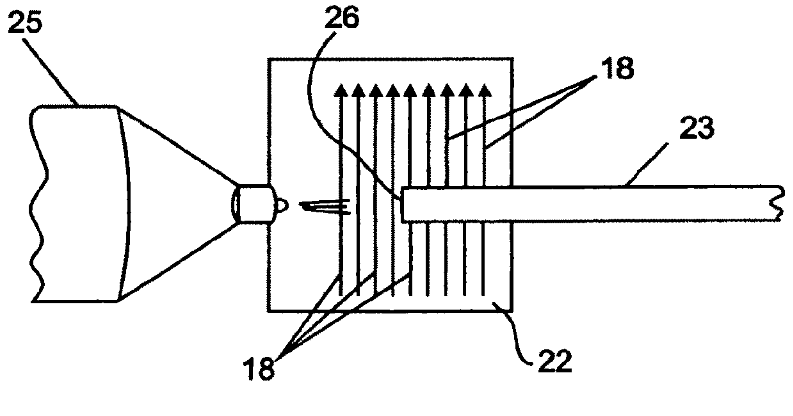
FIG. 3 is a view of the surface to be analyzed and various components of the FIG. 1 system as seen from above in FIG. 2.

For example, there is illustrated in FIG. 3 a view of the emitter 25 and capillary tube 23 arranged in position above the surface 22 for collecting samples from the surface 22 as the surface 22 is indexed beneath the capillary tube tip 26 and moved in sequence along a plurality of Y-coordinate lanes, or paths, indicated by the arrows 18. The characteristics of such relative movements of the surface 22 and the capillary tube 23, such as the sweep speeds and the identity of the X-Y locations at which the collection tube 23 is desired to be positioned in registry with the surface 22 can be input into the computer 30, for example, by way of a computer keyboard 31 or pre-programmed within the memory 33 of the computer 30.

Although a description of the internal components of the XYZ stage 28 is not believed to be necessary, suffice it to say that the X and Y-coordinate position of the support surface 27 (and surface 22) relative to the collection tube tip 26 is controlled through the appropriate actuation of, for example, a pair of reversible servomotors (not shown) mounted internally of the XYZ stage 28, while the Z-coordinate position of the support surface 27 (and surface 22) relative to the collection tube tip 26 is controlled through the appropriate actuation of, for example, a reversible stepping motor (not shown) mounted internally of the XYZ stage 28. Therefore, by appropriately energizing the X and Y-coordinate servomotors, the surface 22 can be positioned so that the tip 26 of the collection tube 23 can be positioned in registry with any spot within the X-Y coordinate plane of the surface 22, and by appropriately energizing the Z-axis stepping motor, the surface 22 can be moved toward or away from the collection tube tip 26.

With reference still to FIG. 1, the system 20 of the depicted example further includes a mass spectrometer 32 which is connected to the collection tube 23 for accepting samples conducted thereto for purposes of analysis, and there is associated with the mass spectrometer 32 a second control computer 34 for controlling the operation and functions of the mass spectrometer 32. An example of a mass spectrometer suitable for use with the depicted system 20 as the mass spectrometer 32 is available from MDS SCIEX of Concord, Ontario, Canada, under the trade designation 4000 Qtrap. Although two separate computers 30 and 34 are utilized within the depicted system 20 for controlling the various operations of the system components (including the mass spectrometer 32), all of the operations performed within the system 20 can, in the interests of the present invention, be controlled with a single computer or, in the alternative, be controlled through an appropriate software component loaded within the mass spectrometer software package. In this latter example, a single software package would control the XYZ staging, the image analysis and the mass spectrometric detection.

It is a feature of the depicted system 20 that it includes image analysis means, generally indicated 40, for controlling the spaced distance (i.e. the distance as measured along the indicated Z-coordinate axis) between the tip 26 of the collection tube 23 and the surface 22. Within the depicted system 20, the image analysis means 40 includes a light source 42 having a beam-emitter 43 supported adjacent the collection tube 23 for directing a beam of light toward the collection tube 23 so that a shadow of (at least a portion of) the collection tube 23 is cast over the surface 22.

It will be understood that depending upon the type of image collected with the image analysis means 40, it may not be necessary to direct a beam of light toward the collection tube for the purpose of casting a shadow of the collection tube across the surface 22. For example, if an image is captured with infrared detection, the resultant image will differentiate between components of differing temperature, and in such a case, a shadow of the capillary tube need not be captured in the collected image. Accordingly and in the broader interest of the invention, the light source 42 is not always necessary.

In addition, a closed circuit color camera 44 is supported to one side of the surface 22 for collecting images of at least a portion of the collection tube 23 and the shadow cast upon the surface 22 by the collection tube 23 in preparation of and during a sample-collection operation, and a video (e.g. a television) monitor 46 is connected to the camera 44 for receiving and displaying the images collected by the camera 44. The monitor 46 is, in turn, connected to the computer 30 (by way of a video capture device 50) for conducting signals to the computer 30 which correspond to the images taken by the camera 44. As will be explained in greater detail herein, it is these collected images which are used to determine the actual, real-time distance between the tip 26 of the collection tube 23 and the surface 22.

Furthermore, the system 20 is provided with a webcam 48 having a lens which is directed generally toward the collection tube 23 and surface 22 and which is connected to the first control computer 30 for providing an operator with a wide-angle view of the capillary tube 23 and the surface 22. The images collected by the webcam 48 are viewable upon a display screen, indicated 52, associated with the computer 30 by an operator to facilitate, in one embodiment of the invention, the initial positioning of the surface 22 relative to the capillary tube 23 in preparation of a sample-collection operation.

An example of a closed circuit camera suitable for use as the camera 44 is available from Panasonic Matsushita Electric Corporation under the trade designation Panasonic GP-KR222, and the camera 44 is provided with a zoom lens, such as is available from Thales Optem Inc. of Fairport, N.Y. under the trade designation Optem 70 XL. An example of a video capture device suitable for use as the video capture device 50 is available under the trade designation Belkin USB Video-Bus II from Belkin Corp. of Compton, Calif., and an example of a webcam which is suitable for use as the webcam 48 is available under the trade designation Creative Notebook Webcam from W. Creative Labs Inc., of Milpitas, Calif.

The operation of the system 20 and its image analysis means 40 can be better understood through a description of the system operation wherein through its use of image analysis, the system 20 monitors the real-time measurement of the distance between the collection tube 23 and the surface 22 to be sampled and thereafter initiates adjustments, as needed, to the actual capillary tube-to-surface distance by way of the computer 30 and the XYZ stage 28 so that the optimum, or desired, capillary tube-to-surface distance (as measured along the Z-axis) is maintained throughout a sampling process, even though the surface 22 might be shifted along the X or Y coordinate axes for purposes of collecting a sample from other spots along the surface 22 or from along different lanes across the surface 22.

At the outset of one embodiment of a sample-collecting operation performed with the system 20, the tip 26 of the capillary tube 23 is positioned (during a set-up phase of the operation) at a desired capillary tube-to-surface distance which corresponds to an optimal, or desired, distance between the capillary tube 23 and the surface 22 for purposes of collecting a sample therefrom, and this optimal distance is calculated (by way of the analysis techniques described herein) and stored within the memory 33 of the computer 30. Such a positioning of the surface 22 in such a desired relationship with the capillary tube 23 is effected through appropriate (e.g. manual) manipulation of the joystick control unit 29 of the XYZ stage 28 and is monitored visually by an operator as he watches the TV monitor 46 during this set-up phase of the operation. Once the surface 22 has been positioned in its desired positional relationship with the capillary tube 23, an initial image is captured by the camera 48 and sent to the computer 30 for analysis.

It will be understood that the aforedescribed manual set-up of the capillary tube 23 at such a desired capillary tube-to-surface distance may not be necessary in a fully automated operation. For example, the XYZ stage 28 may not require re-adjustment between successive sample collecting operations. Therefore, for a second, or subsequent, sample collecting operation involving a similarly-mounted surface, appropriate commands can be input into the computer 30 to initiate a sample collecting operation without the need for a repeated set-up of the capillary tube-to-surface distance to optimum conditions.

The initial image captured by the camera 48 following the aforedescribed set-up phase of the operation includes at least a portion of the capillary tube 23, the shadow of a portion of the capillary tube 23 and the background of the surface 22. For example, there is illustrated in FIGS. **4*a*-4*d* actual captured images of a portion of the capillary tube 23 and the underlying surface 22 when the capillary tube 23 and surface 22 are arranged at various distances from one another. It can be seen in each of the images of FIGS. 4*a*-4*d* that a shadow of the capillary tube 23 is cast across the surface (through the appropriate positioning of the light source 42 relative to the capillary tube 23) and that the shadow is considerably darker than the area of the surface 22** surrounding the shadow.

Figure 5A:
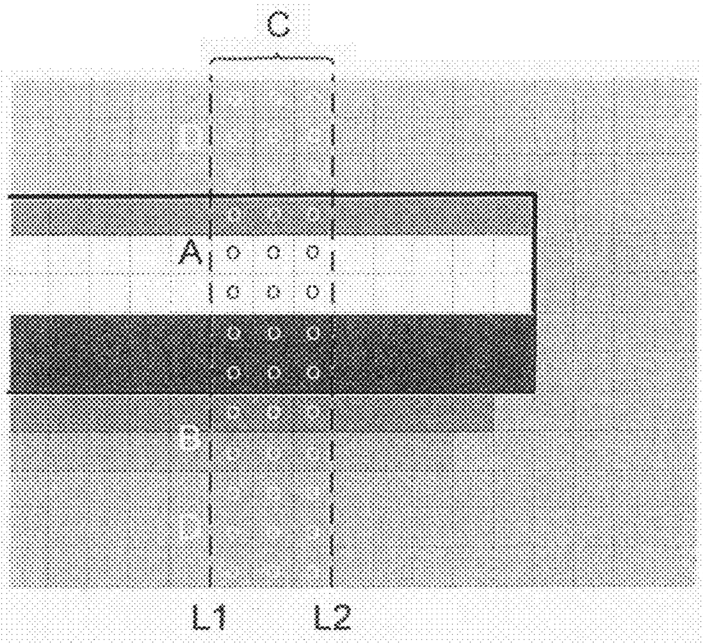
FIG. 5*a* is a schematic representation of a theoretical image with which the image analysis utilized during the method of the present invention can be explained.

The image analysis performed by the system 20 can be best understood with reference to FIG. 5*a* which schematically depicts a 17-pixel by 13-pixel image of a capillary tube and shadow cast across a surface. Within the FIG. 5*a* image, the area designated A is representative of the image of the capillary tube, the area designated B is representative of the image of the shadow of the capillary tube cast across the surface, the area designated C is representative of the area that is bounded by the vertical lines L1 and L2 arranged parallel to the indicated Z-coordinate axis, and the area designated D is representative of the background of the image, i.e. the surrounding surface. Again, it can be seen in the FIG. 5*a* image that the image A of the sampling capillary tube and the image B of its shadow are darker than the remaining part D of the FIG. 5*a* image.

Figure 5B:
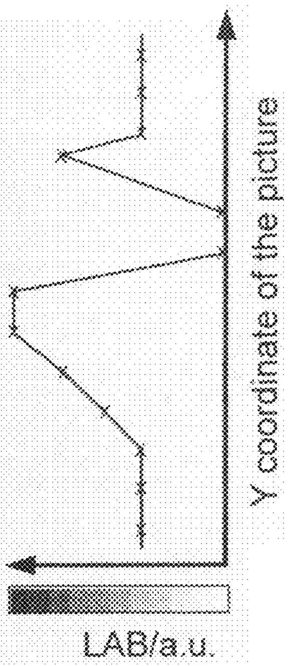
FIG. 5*b* is an attending plot of the LAB along the Z-axis for the theoretical image of FIG. 5*a*.

The brightness of the pixels along the horizontal lines (i.e. those parallel to the indicated X-axis) between L1 and L2 are summed (three pixels in every line, marked by circles in the FIG. 5*a* image). This calculated number represents the average brightness of the horizontal line (i.e. the line average brightness, or LAB) which is plotted in FIG. 5*b* versus the Z coordinate of the FIG. 5*a* image being analyzed. The LABs plotted in FIG. 5*b* are normalized relative to the brightest and the darkest LAB examined in the examined range.

Figure 6:
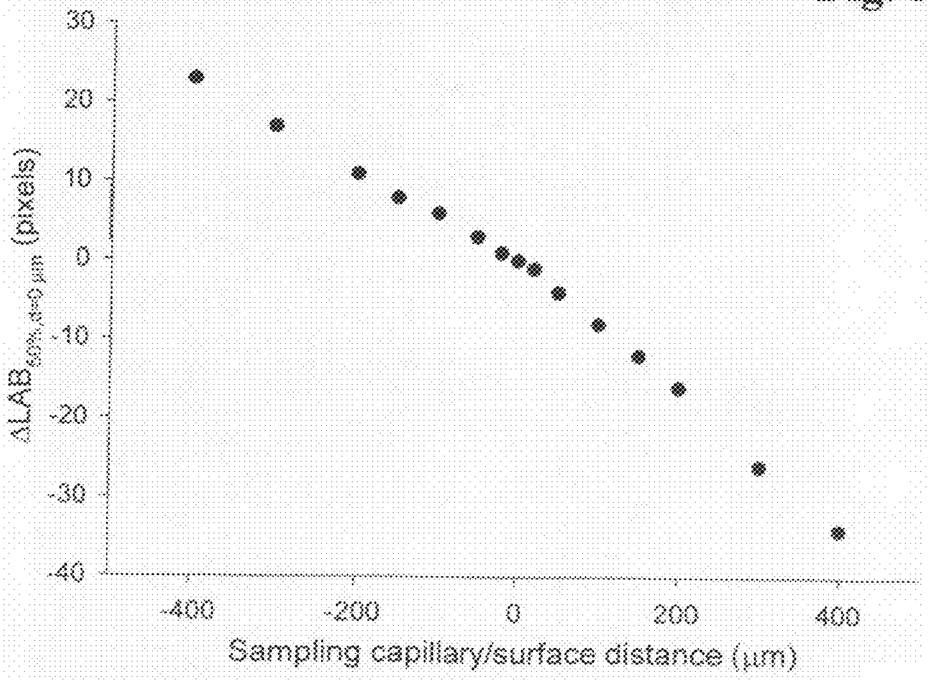
FIG. 6 is a plot of the LAB (e.g. fifty percent of maximum) of captured images as a function of collection instrument-to-surface distance.

With the foregoing LAB analysis in mind and in accordance with the analysis steps described herein, the capillary tube-to-surface distance is calculated by measuring the distance in pixels between a horizontal reference line (which can be imaginary and) which intersects lines L1 and L2 and the Z-coordinate location at which the LAB value first reaches a predetermined percent (in this example, fifty percent) of the maximum LAB value measured on the image. In other words, in the present example and when considering the horizontal reference line to be the bottom edge of the FIG. 5*a* image, the measured distance is acquired by first measuring the distance in pixels between the bottom edge of the FIG. 5*a* image and the Z coordinate location of the image where the LAB value first reaches, for example, fifty percent of the maximum LAB value measured on the image. This measured pixel value is subsequently converted into actual, or real-world (e.g. μm), distance using a predetermined distance/pixel value calibration curve such as is illustrated in FIG. 6. Accordingly and for purposes of this pixel-distance conversion into actual distance, the memory 33 of the computer 30 is preprogrammed with information relating to the actual spaced-apart distance per pixel of the captured image and which has been gathered through empirical means.

Applicants' past success in automated DESI surface sampling experiments has proved that the distance from the afore-described reference line (e.g. the bottom edge of the captured image) and the location along the indicated Z-coordinate direction of FIG. 5*a* at which the LAB first reaches, for example, fifty percent of its maximum measured value is representative of the actual distance between the capillary tube and the surface. Along the same lines, however, applicant does not consider the fifty percent figure (as used as a predetermined percent of the maximum LAB value) to be critical to the image analysis techniques employed in the process described herein. For example, a percentage value of between ten and ninety percent can be selected to indicate the edge of the shadow captured in the collected image.

Once the actual distance between the capillary tube and the surface during this set-up stage (i.e. when the tube-to-surface distance is set to its optimum distance) is determined, that distance is stored in the computer 30 and designated, for present purposes, as the target capillary tube-to-surface distance which is desired to be maintained throughout the sample collection process. In other words, once the target capillary tube-to-surface distance is stored within the computer 30, the sampling process can be initiated by moving the surface 22 relative to the capillary tube 23 in the FIG. 1—indicated X-Y plane for the purpose of collecting samples from desired locations on, or along desired lanes across, the surface 22. During the sampling process, images (comparable to those of FIGS. 4*a*-4*d* in which the capillary tube 23 is spaced from the surface by various distances) of the capillary tube and its shadow cast across the surface are periodically captured, and each image is analyzed to determine the actual tube-to-surface distance, and the actual determined tube-to-surface distance is subsequently compared to the target tube-to-surface distance, and adjustments are made, if necessary, to maintain the actual tube-to-surface distance close to the target tube-to-surface distance.

It will be understood that for comparison purposes, the computer 30 (i.e. the memory 30 thereof) is preprogrammed with information relating to acceptable distance (i.e. tolerance) limits relative to the target distance. In other words, if it is determined that the actual distance differs from the target distance by an amount which is outside of these tolerance limits, commands are sent to the XYZ stage 28 to initiate Z-axis adjustments between the capillary tube 23 and the surface 22 to bring the actual distance back in line with (i.e. within the tolerance limits of) the target distance. It follows that such preset tolerance limits correspond to a predetermined range within which the actual tube-to-surface distance can be close enough (e.g. within ±3 μm) to the desired target tube-to-surface distance that no additional movement of the surface 22 toward or away from the capillary tube 23 is necessary.

It can therefore be seen that the image analysis-based control of the actual capillary tube-to-surface distance during a sample collecting process is comprised of a series of steps. Firstly and if an initial set-up of the capillary tube-to-surface distance is desired in preparation of an image analysis performed with the system 20, an operator adjusts the Z-axis position of the surface 22 until the surface 22 is positioned in relatively close proximity to the tip 26 of the capillary tube 23 so that the capillary tube tip-to-surface distance is optimum for sample collection purposes. During this set-up procedure, the relative position between the surface 22 and the capillary tube tip 26 can be visually monitored by the operator who watches the images obtained through the webcam 48 and displayed upon the display screen 52. As mentioned earlier, however, this initial set-up stage can be omitted in a fully automated operation.

Once the surface 22 is moved into a desired positional relationship with the capillary tube tip 26 during this set-up stage, a light beam is directed from the light source 42 toward the capillary tube tip 26 so that a shadow of (at least a portion of) the capillary tube 23 is cast over the surface 22, and the operator enters appropriate commands into the computer 30 through the keyboard 31 thereof so that an initial image which shows the capillary tube tip 26, the cast shadow of the capillary tube tip 26 and the region of the surface 22 adjacent (e.g. surrounding) the cast shadow is obtained with the camera 44. To obtain a good image of the cast shadow and the adjacent surface 22, the beam-emitter 43 of the light source 42 and the camera 44 are arranged relative to one another so that the path along which the light beam is directed toward the capillary tube tip 26 and the path along which the camera 44 is directed toward the capillary tube tip 26 form about a right angle.

With this initial image obtained, an analysis (described earlier) is then conducted upon the image to determine about how far the shadow of the capillary tube 23 is spaced from a reference line (e.g. a bottom edge) of the image. More specifically and in accordance with the analysis of the present invention, the distance, in pixels, is measured between the reference line and the Z-coordinate location along the image at which the LAB first reaches a predetermined percent (e.g. fifty percent) of the maximum LAB measured on the image. The computer 30 then converts the measured pixel distance to an actual distance with preprogrammed information relating to the actual spaced-apart distance per pixel of the captured image such as is represented by the predetermined distance/pixel value calibration curve of FIG. 6.

Once the determination of this actual (and desired) capillary tube-to-surface distance has been made, the determined distance is stored in the memory 33 of the computer 30 as corresponding with a target distance between the capillary tube tip 26 and the surface 22. When a sample collection process is subsequently undertaken, continual images of the probe tip 26 and the surface 22 and, more specifically, the shadow of the capillary tube tip 26 cast thereon are captured, or taken, with the camera 44. Electrical signals corresponding to these captured images are immediately transmitted to the first control computer 30 where an image analysis is performed upon selected ones of these images. In the interests of the present invention, the phrase "selected ones of the captured images" means the images captured at preselected and regularly-spaced intervals of time (e.g. every one-half second), and the time interval between these selected images for analysis can be preprogrammed into, or selected at, the computer 30.

Along the same lines and from selected ones of the captured images, the computer 30 is able to generate for each image, by way of a suitable program loaded within the computer 30, a plot of the average line brightness (LAB) of each image along the Z-axis or, more specifically, along a path of predetermined width which extends along the Z-axis. These LAB plots are thereafter utilized in the manner discussed above to determine the real-time, or actual, spaced distance between the capillary tube tip 26 and the surface 22.

Figure 4A:
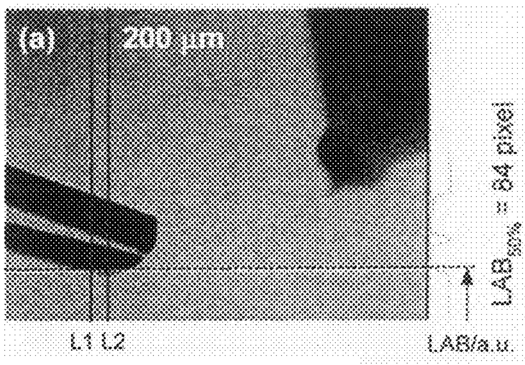
FIGS. 4*a*-4*d* are examples of actual captured images of a portion of the capillary tube and the surface as the capillary tube and surface are moved toward or away from one another and attending plots of the line average brightness (LAB) for each of the captured images.
Figure 4B:
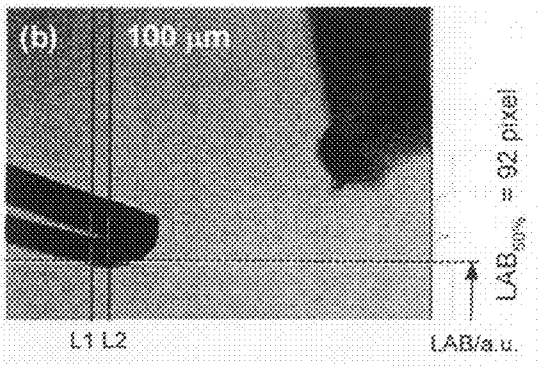
Figure 4C:
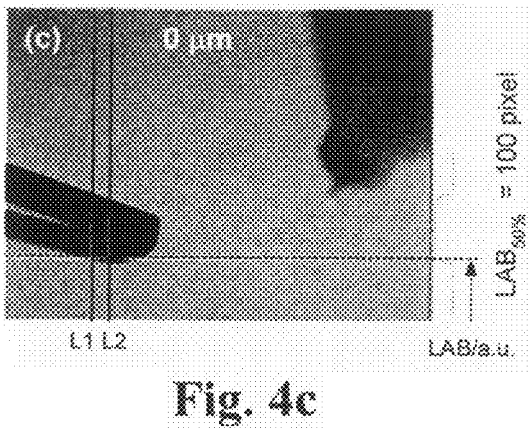
Figure 4D:
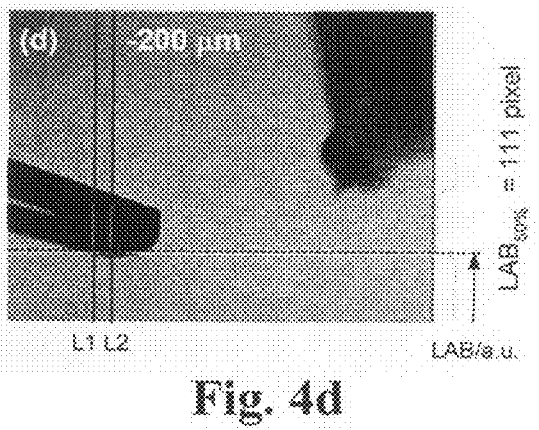

With reference again to FIGS. 4*a*-4*d*, there are illustrated examples of actual captured images of the surface 22 as the surface 22 approaches the capillary tip 26 and corresponding LAB versus Z-axis position plots. The image illustrated in FIG. 4*a* shows the capillary tube 23 disposed relatively distant (i.e. about 200 μm) from the surface 22 with the resulting Z-axis versus brightness plot wherein the position (e.g. the dotted line position) indicating the location along the Z-axis at which the LAB curve first reaches fifty percent of the maximum value of the LAB measured in the image (indicated 50% of $LAB_{MAX}$, or $LAB_{50\%}$) is spaced about eighty-four pixels from the bottom edge of the image. As the distance between the capillary tube tip 26 and the surface 22 decreases, the shadow E of the capillary tube 23 moves further away from the bottom edge of the image. For example, the image in FIG. 4*b* shows the capillary tube 23 disposed at a distance of about 100 μm from the surface 22, and the location in this FIG. 4*b* image at which the LAB curve first reaches 50% of $LAB_{MAX}$ is about ninety-two pixels from the bottom edge of the image, and the image in FIG. 4*c* shows the capillary tube 23 disposed at a distance of about 0 μm from the surface 22, and the location in this FIG. 4*c* image at which the LAB curve first reaches 50% of $LAB_{MAX}$ is about one-hundred pixels from the bottom edge of the image. By comparison, the image depicted in FIG. 4*d* shows the capillary tube 23 disposed at a distance of about −200 μm from the surface 22 (representing a bending or raising of the capillary tube 23 from the position depicted in FIG. 4*c*), and the location in this FIG. 4*c* image at which the LAB curve first reaches 50% of $LAB_{MAX}$ is about one-hundred and eleven pixels from the bottom edge of the image.

As far as the analysis of the collected samples are concerned, the samples collected from the surface 22 through the collection tube 23 are conducted to the mass spectrometer 32 and are analyzed thereat in a manner known in the art. If desired, a second control computer 34 (FIG. 1), having a display screen 38 and a keyboard 39, can be connected to the mass spectrometer 32 for controlling its operations. In other words, the keyboard 39 can be used for entering commands into the computer 34 and thereby controlling the operation and data collection of the mass spectrometer 32.

It is common that during a sample-collection operation performed with the system 20, the surface 22 is moved relative to the capillary tube 23 within the X-Y plane so that the tip 26 of the capillary tube 23 samples the surface 22 as the surface 22 sweeps beneath the probe 24. For this purpose and by way of example, the computer 30 can be pre-programmed to either index the surface 22 within the X-Y plane so that alternative locations, or spots, can be positioned in sample-collecting registry with the capillary tube tip 26 for obtaining samples at the alternative locations or to move the surface 22 along an X or Y coordinate axis so that the surface 22 is sampled with the capillary tube 23 along a selected lane (such as the paths 18 of FIG. 3) across the surface 22.

Figure 7A:
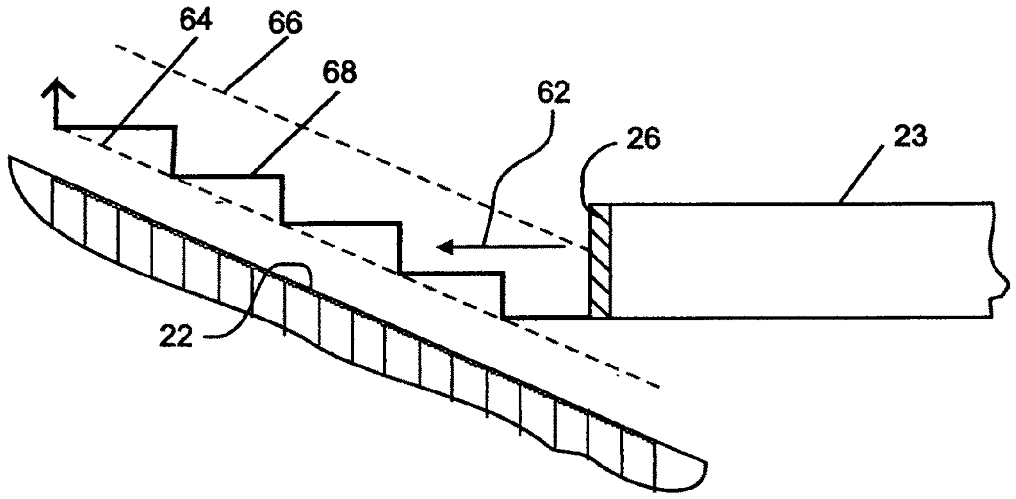
FIGS. 7*a* and 7*b* are views illustrating schematically the path of the tip of a sample collection instrument relative to the surface of FIG. 1 during a continuous re-optimization of the collection instrument-to-surface distance.
Figure 7B:
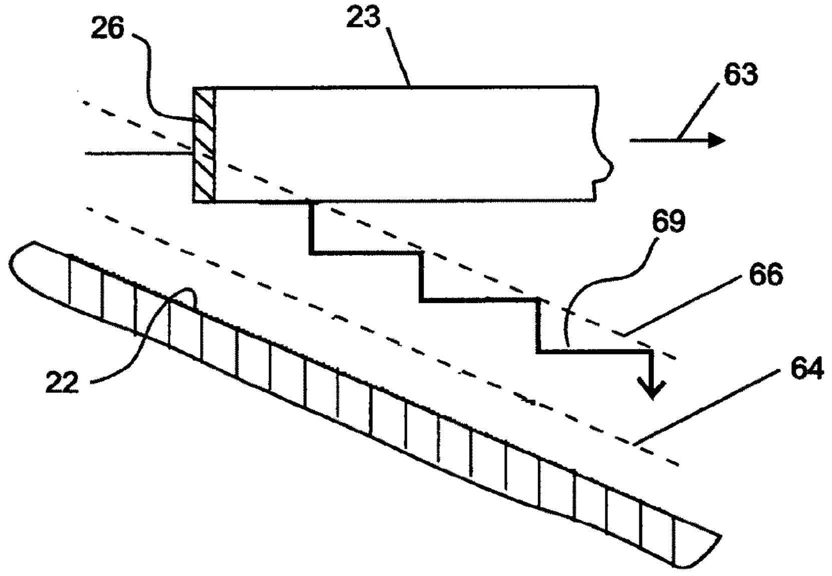

With reference to FIGS. 7*a* and 7*b*, there is schematically illustrated the positional relationship between the surface 22 and the capillary tube tip 26 as the surface 22 is passed beneath the capillary tube tip 26 during a sample-collection operation and the movement of the capillary tube tip 26 during a re-optimization of the capillary tube-to-surface position. (Within both FIGS. 7*a* and 7*b*, the surface 22 is depicted at an exaggerated angle with respect to the longitudinal axis of the capillary tube for illustrative purposes.) More specifically and within FIG. 7*a*, the surface 22 and the capillary tube 23 are moved relative to one another during a sample-collection process so that samples are collected from a lane of the surface 22 in the negative (−) X-coordinate direction indicated by the arrow 62, and within FIG. 7*b*, the surface 22 and the capillary tube 23 are moved relative to one another during a sample-collection process so that samples are collected from a lane of the surface 22 in the positive (+) X-coordinate direction indicated by the arrow 63.

Meanwhile, the dotted lines 64 and 66 depicted in FIGS. 7*a* and 7*b* indicate the outer boundaries, or preset limits, between which the capillary tube tip 26 should be positioned in order that the optimum, or desired, distance is maintained between the surface 22 and the capillary tube tip 26 for sample collecting purposes. For example and in order to maintain the spaced-apart distance between the capillary tube 26 and the surface 22 at a distance which corresponds to the optimum for sample collecting purposes, the capillary tube tip 26 should not be moved closer to the surface 22 (along the Z-axis) than is the line 64 nor should the capillary tube tip 26 be moved further from the surface 22 than is the line 66. In practice, the spaced-apart distance between the preset limits (as measured along the Z-axis) can be within a few microns, such as about 6 μm, from one another so that the preset limits (corresponding to the dotted lines 64 and 66) are each spaced at about 3 μm from the target distance at which the surface 22 is optimally-arranged relationship to the capillary tube tip 26. Accordingly and during a sample-collection operation performed with the system 20, images are captured at regularly-spaced intervals and, through the image analysis-techniques described above, the actual distance between the capillary tube tip 26 and the surface 22 is determined.

The determined actual distance is then compared, by means of appropriate software 70 (FIG. 1) running in the computer 30, to the desired target distance between the capillary tube tip 26 and the surface 22, which target distance is bounded by the prescribed limit lines 64 and 66 (of FIGS. 7*a* or 7*b*). If the actual capillary tube-to-surface distance is determined to fall within the prescribed limit lines 64 and 66, no relative movement or adjustment of the surface 22 and the capillary tube tip 26 along the Z-axis is necessary. However, if the actual capillary tube-to-surface distance is determined to fall upon or outside of the prescribed limit lines 64 and 66, relative movement between or an adjustment of the relative position between the surface 22 and the capillary tube tip 26 is necessary to bring the actual capillary tube-to-surface distance back within the prescribed limits corresponding with the limit lines 64 and 66. Accordingly and during a sample-collection operation as depicted in FIG. 7*a* in which frequent adjustments of the surface 22 and the probe 24 along the Z-axis must be made as the capillary tube 23 is moved relative to the surface 22 along the negative (−) X-coordinate axis, the path followed by the capillary tube tip 26 relative to the surface 26 can be depicted by the stepped path 68.

By comparison and during a sample-collection operation as depicted in FIG. 7*b* in which frequent adjustments of the surface 22 and the capillary tube 26 along the Z-axis must be made as the capillary tube 23 is moved relative to the surface 22 along the positive (+) X-coordinate axis, the path followed by the capillary tube tip 26 relative to the surface 22 can be depicted by the stepped path 69.

It follows from the foregoing that a system 20 and associated method has been described for controlling the capillary tube-to-surface distance during a surface sampling process. In this connection, the system 20 automates the formulation of real-time re-optimization of the sample collection instrument-to-surface distance using image analysis. The image analysis includes the periodic capture of still images from a video camera 44 whose lens is directed toward the region adjacent the tip 26 of the capillary tube 23 followed by analysis of the captured images to determine the actual capillary tube-to-surface distance. By determining this actual capillary tube-to-surface distance and then comparing the actual capillary tube-to-surface distance to a target capillary tube-to-surface distance which corresponds to the actual capillary tube-to-surface distance which can, for example, be established during a set-up phase of the procedure, the system 20 can automatically and continuously re-optimize the capillary tube-to-surface distance during the sample collection procedure by adjusting the spaced capillary tube-to-surface distance, as necessary, along the Z-coordinate axis. If desired, the surface 22 can be moved along the X-Y plane (and relative to the capillary tube 23) to accommodate the automatic collection of samples with the capillary tube 23 along multiple parallel lanes upon the surface 22 with equal or customized spacing between the lanes. Samples can be collected with the aforedescribed system 20 at constant scan speeds or at customized, or varying, scan speeds.

The principle advantages provided by the system 20 and associated method for controlling the capillary tube-to-surface distance throughout a sample-collection process relate to the obviation of any need for operation intervention and manual control of the capillary tube-to-surface distance (i.e. along the Z-coordinate axis) during a sample-collection process. Accordingly, the precision of a sample-collection operation conducted with the system 20 will not be limited by the skill of an operator required to monitor the sample-collection process. Moreover, the system 20 also provides advantages which bear directly upon the accuracy of samples collected with the capillary tube 23. For example, because the optimum, or desired, capillary tube-to-surface distance is maintained throughout the sample collecting process, the likelihood that the surface 22 would be inaccurately sampled—which could lead to misinterpretation of the collected samples, when analyzed—is substantially reduced.

The aforedescribed system 20 and process provides a further advantage in sample collecting equipment which employs componentry, such as the emitter 25 having a spray tip, which are intended to be positioned in a desired spatial relationship, or assignment, with one another. For example, in a sample collection system in which a spray tip and surface to be sampled are typically arranged in a fixed relationship with respect to one another during a sample collection operation, a change in the spray tip-to-surface distance also results in a change in the sampling capillary-to-surface distance by a corresponding amount. However, because the system 20 and process of the present invention helps to maintain a desired capillary tube-to-surface distance during a sample collecting process, the system 20 and process also helps to maintain desired spatial relationship between the emitter, the collection tube and the surface to be sampled.

Applicants have determined that the system and method described herein can be used for improving imaging applications, and such improvements have been substantiated through experimentation. For example and in two experiments, applicants have attempted to reconstruct, through chemical imaging, the heart-shaped image depicted in FIG. 8*a* in accordance with the principles of the present invention. In this connection, the heart-shaped image of FIG. 8*a* (which measured about 18 mm by 14.5 mm in area) was pre-printed on a sheet of printer paper with red ink containing as its principle dye rhodamine B, and the pre-printed sheet was affixed to the XYZ stage and purposely canted with respect to the plane (i.e. X-Y plane) within which the capillary tube tip 26 is positioned. More specifically, the sheet containing the heart-shaped image was arranged at an angle of 1.35 degrees relative to the X-Y plane (i.e. the true horizontal plane). In other words and for these experiments, the left side of the pre-printed sheet as viewed in FIG. 8*a* was lower than the right side of the paper by about 400 μm.

Figure 8A:
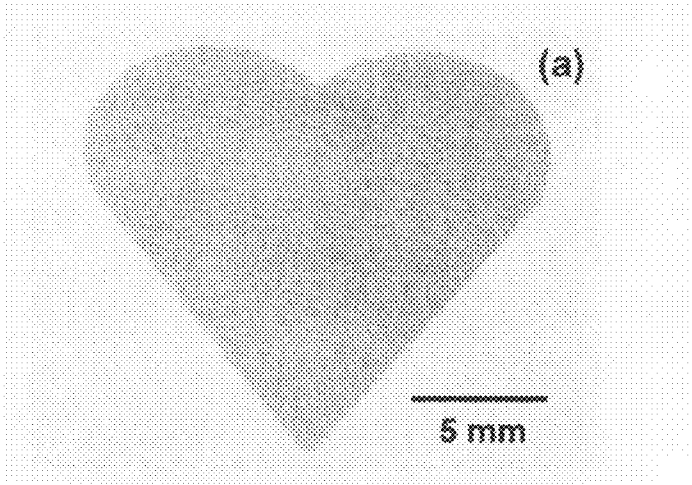
FIG. 8*a* is a view of a heart-shaped image which has been pre-printed on a piece of paper.

By positioning the capillary tube 23 and emitter 25 adjacent the surface of the pre-printed sheet of FIG. 8*a* and scanning the sheet as one might normally scan a surface for sample collecting purposes, extracted ion current images of the ink component can be had. In other words, as the pre-printed sheet of FIG. 8*a* is scanned with the capillary tube 23 and emitter 25 for chemical imaging the FIG. 8*a* sheet, a companion image indicative of the strength of the ion current signals of the detected ink is reproduced by DESI-MS imaging.

Figure 8B:
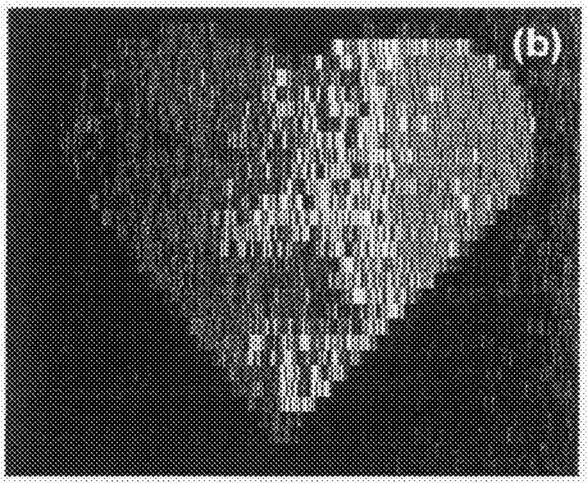
FIG. 8*b* is a representation of a heart-shaped image which has been reconstructed by chemically imaging the heart-shape image of FIG. 8*a* without utilizing the re-optimization steps of the process of the present invention.

In a first experiment, the heart-shaped image of the pre-printed sheet was chemically imaged (at a scan rate of 100 μm/sec) without any optimization of the distance that the capillary tube 23 is arranged relative to the location on the sheet over which the tube 23 is positioned. In other words and during this first experiment, the XYZ stage was not adjusted so that the pre-printed sheet was moved along the Z-axis to adjust the capillary tube-to-sheet distance. The extracted ion current image of this first experiment is depicted in FIG. 8*b*; and it can be seen in the left-hand portion of the heart-shaped image of FIG. 8*a* was not reconstructed very well in FIG. 8*b*, thus indicating that the strength of the ink signals detected as the left-hand portion of the pre-printed sheet of FIG. 8*a* was scanned was relatively low.

Figure 8C:
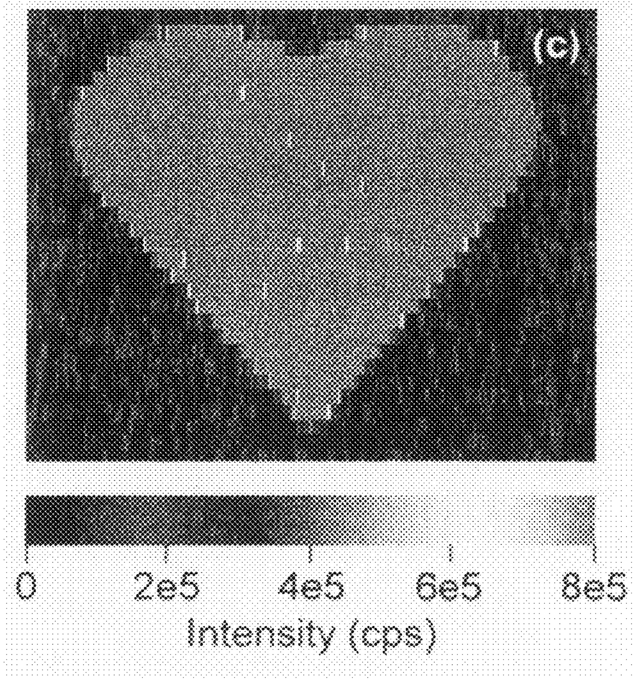
FIG. 8*c* is a representation of a heart-shaped image which has been reconstructed by chemically imaging the heart-shaped image of FIG. 8*a* with the re-optimization steps of the process of the present invention.

In a second experiment, the collection tube-to-surface distance was adjusted in position by the image analysis steps of the process of the present invention so that the capillary tube-to-pre-printed sheet was optimized as the pre-printed sheet distance was chemically imaged in a sample collecting operation. The heart-shaped image reconstructed during this second experiment is illustrated in FIG. 8*c*; and it can be seen that the entirety of the reconstructed (FIG. 8*c*) image is homogeneous and substantially the same as that shown in FIG. 8*a*, thus indicating that the strength of the detected ink signal over the heart-shaped image of the pre-printed sheet of FIG. 8*a* was strong (and relatively constant) throughout the scanning process.

It will be understood that numerous modifications and substitutions can be had to the aforedescribed embodiment without departing from the spirit of the invention. For example, although the aforedescribed embodiments have been shown and described wherein the capillary tube 23 is supported in a fixed, stationary condition and the surface 22 is moved relative to the capillary tube 23 along either the X, Y or Z-coordinate directions to position a desired spot or development lane in registry with the capillary tube 23, alternative embodiments in accordance with the broader aspects of the present invention can involve a surface which is supported in a fixed, stationary condition and a probe which is movable relative to the surface along either the X, Y or Z coordinate directions. Accordingly, the aforedescribed embodiments are intended for the purpose of illustration and not as limitation.

The invention claimed is:

1. A sampling system comprising:

a collection instrument through which a sample is collected from a surface to be analyzed;

means for moving the collection instrument and the surface toward and away from one another and wherein there exists a desired positional relationship between the collection instrument and the surface for sample collecting purposes;

means for capturing an image of at least a portion of the collection instrument or a shadow thereof and for generating signals which correspond to the captured image;

means for receiving the signals which correspond to the captured image and for determining an actual positional relationship between the collection instrument and the surface from the captured image; and comparison means for comparing the actual positional relationship between the collection instrument and the surface to the desired positional relationship and for initiating the movement of the collection instrument and the surface toward and away from one another when the difference between the actual positional relationship between the collection instrument and the surface and the desired positional relationship is outside of a predetermined range so that by moving the surface and the collection instrument toward or away from one another, the actual positional relationship approaches the desired positional relationship; and wherein the means for determining the actual positional relationship between the collection instrument and the surface from the captured image includes means for calculating a distance between a reference location on the image and the collection instrument or the shadow thereof in the image so that the determination of the actual distance between the collection instrument and the surface utilizes the calculated distance, and wherein the means for determining the actual positional relationship is adapted to utilize line average brightness (LAB) techniques with the captured image for determining the actual distance between the collection instrument and the surface.

2. The system as defined in claim 1 wherein the means for determining the actual positional relationship is adapted to measure the distance between the reference location and the location on the image at which the LAB first reaches a predetermined percent of the maximum LAB measured on the image.

3. The system as defined in claim 2 wherein the predetermined percent of the maximum LAB is about fifty percent.

4. The system as defined in claim 1 wherein the reference location on the captured image.

5. The system as defined in claim 4 wherein the means for calculating the distance between the reference location on the image and the collection instrument or the shadow thereof in the image is adapted to calculate the pixel-distance between said edge and the collection instrument or the shadow thereof and to covert the calculated pixel-distance to the actual distance.

6. The system as defined in claim 1 wherein the surface which is sampled with the collection instrument is disposed substantially within an X-Y plane and is spaced from the collection instrument along a Z-coordinate axis, and the means for moving the surface and the collection instrument toward and away from one another further includes means for moving the surface relative to the collection instrument within the X-Y plane so that any of a number of coordinate locations along the surface can be positioned adjacent the collection instrument for sample collecting purposes.

7. In a surface sampling system for sampling a surface to be analyzed for analysis wherein the system includes a collection instrument with which the surface is sampled and wherein there exists a desired target distance between the collection instrument and the surface for sample collecting purposes, the improvement comprising:

a computer containing information relating to the desired target distance between the collection instrument and the surface for sample collecting purposes;

means connected to the computer for moving the surface and the collection instrument toward and away from one another in response to commands received from the computer;

means for capturing an image of the collection instrument or a shadow thereof cast upon the surface and for sending signals to the computer which correspond to the captured image;

the computer includes means for receiving the signals which correspond to the captured image and for determining an actual distance between the collection instrument and the surface from the captured image wherein the means for determining the actual distance includes means for calculating a distance between a reference location on the image and the collection instrument or the shadow thereof in the image so that the determination of the actual distance between the collection instrument and the surface utilizes the calculated distance; and the computer further includes comparison means for comparing the actual distance between the collection instrument and the surface and the target distance and for initiating the movement of the surface and the collection instrument toward or away from one another so that the actual distance approaches the target distance when the actual distance between the collection instrument and the surface is outside of a predetermined range, and wherein the means for determining the actual positional relationship is adapted to utilize line average brightness (LAB) techniques with the captured image for determining the actual distance between the collection instrument and the surface.

8. The improvement of claim 7 wherein the means for determining the actual distance between the collection instrument and the surface is adapted to measure the distance between the reference location and the location on the image at which the LAB first reaches a predetermined percent of the maximum LAB measured on the image as a path is traced from the reference location toward the collection instrument or the shadow thereof.

9. The improvement of claim 7 wherein the reference location on the captured image is an edge of the image.

10. The improvement of claim 9 wherein the means for calculating the distance between the reference location on the image and the collection instrument or the shadow thereof in the image is adapted to calculate the pixel-distance between said edge and the collection instrument or the shadow thereof and to covert the calculated pixel-distance to the actual distance.

11. A sampling system comprising:

a collection instrument through which a sample is collected from a surface to be analyzed;

means for moving the collection instrument and the surface toward and away from one another and wherein there exists a desired positional relationship between the collection instrument and the surface for-sample collecting purposes;

a light source for directing a light beam toward the collection instrument so that a shadow of the collection instrument is cast upon the surface;

means for capturing an image of at least a portion of the shadow of the collection instrument cast upon the image and for generating signals which correspond to the captured image;

means for receiving the signals which correspond to the captured image and for determining an actual positional relationship between the collection instrument and the surface from the captured image; and comparison means for comparing the actual positional relationship between the collection instrument and the surface to the desired positional relationship and for initiating the movement of the collection instrument and the surface toward and away from one another when the difference between the actual positional relationship between the collection instrument and the surface and the desired positional relationship is outside of a predetermined range so that by moving the surface and the collection instrument toward or away from one another, the actual positional relationship approaches the desired positional relationship; and wherein the means for determining the actual positional relationship between the collection instrument and the surface from the captured image includes means for calculating a distance between a reference location on the image and the shadow of the collection instrument in the image so that the determination of the actual distance between the collection instrument and the surface utilizes the calculated distance, and wherein the means for determining the actual positional relationship is adapted to utilize line average brightness (LAB) techniques with the captured image for determining the actual distance between the collection instrument and the surface.

12. A method for sampling a surface to be analyzed, the method comprising the steps of:

providing a collection instrument through which a sample is collected from a surface to be analyzed for analysis when the collection instrument is disposed at a desired positional relationship with respect to the surface;

supporting the collection instrument and the surface relative to one another to permit movement of the collection instrument and the surface toward and away from one another;

capturing an image of at least a portion of the collection instrument or a shadow thereof cast upon the surface;

determining an actual positional relationship between the collection instrument and the surface from the captured image wherein the step of determining the actual positional relationship includes a step of calculating a distance from a reference location on the image and the collection instrument or the shadow thereof in the image so that the step of determining the actual positional relationship between the collection instrument and the surface utilizes the calculated distance by a computer, wherein the step of determining the actual positional relationship utilizes line average brightness (LAB) techniques with the captured image for determining the actual distance between the collection instrument and the surface; and comparing the actual positional relationship between the collection instrument and the surface to the desired positional relationship and initiating the movement of the surface and the collection instrument toward or away from one another when the difference between the actual positional relationship and the desired positional relationship is outside of a predetermined range.

13. The method as defined in claim 12 wherein the step of determining the actual positional relationship includes the steps of measuring the distance between the reference location and the location on the image at which the LAB first reaches a predetermined percent of the maximum LAB measured on the image as a path is traced from the reference location toward the collection instrument.

14. The method as defined in claim 12 wherein the reference location on the captured image utilized during the determining step is an edge of the image so that the step of determining the distance from a reference location on the image includes the step of determining the distance between the edge of the image and the collection instrument or the shadow thereof on the image.

15. The method as defined in claim 14 wherein the step of calculating the distance from the reference location on the image and the collection instrument or the shadow thereof cast upon the surface includes the steps of calculating the pixel-distance between the edge of the image and the collection instrument or the shadow thereof and converting the calculated pixel-distance to the actual distance.

16. The method as defined in claim 12 wherein the steps of capturing, determining, comparing and moving are repeated, as needed, until the actual distance between the collection instrument and the surface is within a predetermined range of the desired distance.

17. The method as defined in claim 12 wherein the steps of capturing, determining, comparing and moving are carried out during a sampling process involving the movement of the surface and the collection instrument relative to one another so that alternative locations of the surface are positioned adjacent the collection instrument for sample collecting purposes and so that during the sampling process, the actual distance between the collection instrument and the surface is maintained within a predetermined range of the distance.

18. The method as defined in claim 12 wherein the step of supporting positions, at the outset of a sample collecting process, the collection instrument and the surface in a desired positional relationship with respect to one another for sample collecting purposes and is followed by the steps of:

capturing an initial image of at least a portion of the collection instrument or the shadow thereof cast upon the surface; and obtaining information relating to the desired positional relationship between the collection instrument and the surface from the initial image so that the information relating to the desired positional relationship to which the actual positional relationship is compared during the step of comparing is obtained from the initial image.

19. A method for sampling a surface to be analyzed, the method comprising the steps of:

providing a collection instrument through which a sample is collected from a surface to be analyzed for analysis when the collection instrument is disposed at a desired positional relationship with respect to the surface;

supporting the collection instrument and the surface relative to one another to permit movement of the collection instrument and the surface toward and away from one another;

directing a light beam toward the collection instrument so that a shadow of the collection instrument is cast upon the surface;

capturing an image of at least a portion of the shadow of the collection instrument cast upon the surface;

determining an actual positional relationship between the collection instrument and the surface from the captured image wherein the step of determining the actual positional relationship includes a step of calculating a distance from a reference location on the image and the shadow of the collection instrument in the image so that the step of determining the actual positional relationship between the collection instrument and the surface utilizes the calculated distance by a computer, wherein the step of determining the actual positional relationship utilizes line average brightness (LAB) techniques with the captured image for determining the actual distance between the collection instrument and the surface; and comparing the actual positional relationship between the collection instrument and the surface to the desired positional relationship and initiating the movement of the surface and the collection instrument toward or away from one another when the difference between the actual positional relationship and the desired positional relationship is outside of a predetermined range.

* * * * *